(12) United States Patent
Lee et al.

(10) Patent No.: US 11,980,099 B2
(45) Date of Patent: May 7, 2024

(54) TRANSITION METAL DICHALCOGENIDE HOMOJUNCTION STRUCTURE WITH IMPROVED SEEBECK COEFFICIENT AND METHOD OF FORMING THE SAME

(71) Applicant: CHUNG ANG UNIVERSITY INDUSTRY ACADEMIC COOPERATION FOUNDATION, Seoul (KR)

(72) Inventors: Sang Kwon Lee, Seongnam-si (KR); No Won Park, Jeonju-si (KR); Jae Won Choi, Seoul (KR)

(73) Assignee: CHUNG ANG UNIVERSITY INDUSTRY ACADEMIC COOPERATION FOUNDATION, Seoul (KR)

( * ) Notice: Subject to any disclaimer, the term of this patent is extended or adjusted under 35 U.S.C. 154(b) by 0 days.

(21) Appl. No.: 18/083,990

(22) Filed: Dec. 19, 2022

(65) Prior Publication Data
US 2024/0107886 A1 Mar. 28, 2024

(30) Foreign Application Priority Data
Sep. 22, 2022 (KR) .................. 10-2022-0120011

(51) Int. Cl.
*H10N 10/852* (2023.01)
*H10N 10/01* (2023.01)

(52) U.S. Cl.
CPC .......... *H10N 10/852* (2023.02); *H10N 10/01* (2023.02)

(58) Field of Classification Search
CPC .............................. H10N 10/852; H10N 10/01
See application file for complete search history.

(56) References Cited

FOREIGN PATENT DOCUMENTS

KR 10-1953955 B1 5/2019

OTHER PUBLICATIONS

Lee, Interface-Induced Seebeck Effect in PtSe2/ PtSe2 van der Waals Homostructures, ACS Nano 2022, 16, 3404-3416 (Year: 2022).*
Yuan, Wafer-Scale Fabrication of Two-Dimensional PtS2/PtSe2 Heterojunctions for Efficient and Broad band Photodetection, ACS Appl. Mater. Interfaces 2018, 10, 40614-40622 (Year: 2018).*

* cited by examiner

*Primary Examiner* — Devina Pillay
(74) *Attorney, Agent, or Firm* — Bridgeway IP Law Group, PLLC; Sang Ho Lee; Hyun Woo Shin

(57) ABSTRACT

A transition dichalcogenide homojunction structure may include a lower high resistance layer including a plurality of $PtX_2$ layers and an upper low resistance layer which includes the plurality of $PtX_2$ layers and has different thickness and number of growth layers from the lower high resistance layer. And the lower high resistance layer and the upper low resistance layer may form a homojunction. The heat transfer characteristic of the lower high resistance layer may increase by the interface induced Seebeck effect with the upper low resistance layer. The transition dichalcogenide homojunction structure may generate the interface induced Seebeck effect at the interface of the homojunction to generate a thermal voltage. Further, the transition metal dichalcogenide homojunction structure may measure the Seebeck effect of the lower high resistance layer using the upper low resistance layer without separate measurement equipment.

8 Claims, 9 Drawing Sheets

100

200

TRANSITION METAL DICHALCOGENIDE HOMOJUNCTION STRUCTURE WITH IMPROVED SEEBECK COEFFICIENT AND METHOD OF FORMING THE SAME

CROSS-REFERENCE TO RELATED APPLICATIONS

This application claims the priority of Korean Patent Application No. 10-2022-0120011 filed on Sep. 22, 2022, in the Korean Intellectual Property Office, the disclosure of which is incorporated herein by reference.

BACKGROUND

Field

The present disclosure relates to a transition metal dichalcogenide homojunction structure, and more particularly, to a $PtX_2$ based transition metal dichalcogenide homojunction structure with an improved Seebeck coefficient and a method for forming the same.

DESCRIPTION OF THE RELATED ART

Generally, the thermoelectric (TE) energy conversion is an essential technology in the field of an energy generation application which converts waste heat into electrical power. The thermoelectric efficiency is characterized by a dimensionless figure of merit ($ZT=(S^2\sigma T)/\kappa$) in which $\sigma$ is an electrical conductivity, S is a Seebeck coefficient, T is an absolute temperature, and $\kappa$ is a thermal conductivity. Therefore, the thermoelectric efficiency may be improved by increasing a power factor $S^2\sigma$ and lowering a thermal conductivity of a thermoelectric material.

A two-dimensional (2D) transition metal dichalcogenide (TMDC), such as $MoX_2$ (X=S, Se), $WX_2$ (X=S, Se), and $PtX_2$ (X=S, Se, Te) has a large energy bandgap and an atomically thin layer to be used in thermoelectric applications as promising materials. An important physical parameter for the design of a 2D TMDC material having a high thermoelectric efficiency is a Seebeck coefficient evaluated as a general Seebeck effect. However, it is not easy to measure the Seebeck coefficient for a single layered or a few layered (<triple layer) TMDC thin films. Specifically, it is more difficult to measure the Seebeck coefficient for the TMDC having a high resistance (>10 MΩ) in a millimeter unit.

Further, the high resolution (<1 nV) measurement equipment cannot measure the Seebeck coefficient for the TMDC thin film in the millimeter unit using the DC based method of the related art.

SUMMARY

An object of the present disclosure is to provide a transition metal dichalcogenide homojunction structure which forms a homojunction with a lower high resistance layer and an upper low resistance layer, and generates an interface induced Seebeck effect at an interface of the homojunction to generate a thermal voltage.

Another object of the present disclosure is to provide a transition metal dichalcogenide homojunction structure in which a Seebeck effect of the lower high resistance layer is measured using an upper low resistance layer without separate measurement equipment.

Still another object of the present disclosure is to provide a transition metal dichalcogenide homojunction structure having a high power factor according to a high thermoelectric characteristic with respect to the same thickness.

However, the objects to be achieved by the present disclosure are not limited to the above-mentioned objects and may be variously expanded in the range without departing from the spirit and the scope of the present disclosure.

In order to achieve one object of the present disclosure, according to an aspect of the present disclosure, a transition metal chalcogenide homojunction structure may include a lower high resistance layer including a plurality of $PtX_2$ layers; and an upper low resistance layer which includes the plurality of $PtX_2$ layers and has different thickness and number of growth layers from the lower high resistance layer. The lower high resistance layer and the upper low resistance layer may form a homojunction. The heat transfer characteristic of the lower high resistance layer may increase by the interface induced Seebeck effect with the upper low resistance layer.

In one exemplary embodiment, the lower high resistance layer and the upper low resistance layer may form a homojunction of multilayered $PtSe_2$ thin films.

In one exemplary embodiment, the upper low resistance layer activates the lower high resistance layer to induce the injection of hot carries from the lower high resistance layer into the upper low resistance layer.

In one exemplary embodiment, the hot carries which are injected from the lower high resistance layer to the upper low resistance layer move from the lower high resistance layer to the upper low resistance layer together with thermally induced thermocurrent to increase a Seebeck coefficient.

In one exemplary embodiment, the lower high resistance layer and the upper low resistance layer may be formed by a first step of depositing a Pt thin film on an $SiO_2$/Si substrate using an RF sputter in the Ar atmosphere and a second step of performing the selenization on the Pt thin film by a CVD method in the $Ar/H_2$ atmosphere and at a temperature of 400° C. to 500° C.

In one exemplary embodiment, the lower high resistance layer is formed with a thickness of 1 nm to 3 nm, and the upper low resistance layer may be formed with a thickness of 8 nm to 12 nm.

In one exemplary embodiment, the lower high resistance layer includes the $PtSe_2$ thin film configured by four growth layers, and the upper low resistance layer may include the $PtSe_2$ thin film configured by 18 growth layers.

In one exemplary embodiment, the lower high resistance layer has a resistance of 10 MΩ to 11 MΩ, and the upper low resistance layer may have a resistance of 300Ω to 20 KΩ.

In order to achieve another object of the present disclosure, according to an aspect of the present disclosure, a method for forming a transition metal dichalcogenide homojunction structure may include depositing a Pt thin film on an $SiO_2$/Si substrate using the RF sputter at the Ar atmosphere; performing selenization on the Pt thin film by the CVD method in the $Ar/H_2$ atmosphere and at the temperature of 400° C. to 500° C.; and forming a homojunction of the lower high resistance layer and the upper low resistance layer. The lower high resistance layer and the upper low resistance layer may have different thicknesses and different numbers of growth layers. The heat transfer characteristic of the lower high resistance layer may be increased by the interface induced Seebeck effect with the lower resistance layer.

In one exemplary embodiment, the lower high resistance layer and the upper low resistance layer may form a homojunction of multilayered $PtSe_2$ thin films.

The transition metal dichalcogenide homojunction structure according to the present disclosure forms a homojunction with a lower high resistance layer and an upper low resistance layer, and may generate an interface induced Seebeck effect at an interface of the homojunction to generate a thermal voltage.

Further, the transition metal dichalcogenide homojunction structure according to the present disclosure may measure the Seebeck effect of the lower high resistance using the upper low resistance layer without separate measurement equipment.

Further, the transition metal dichalcogenide homojunction structure according to the present disclosure has a high thermoelectric characteristic with respect to the same thickness to have a high power factor.

However, the effect of the present disclosure is not limited the above-described effect and may be variously expanded in a range without departing from the spirit and the scope of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
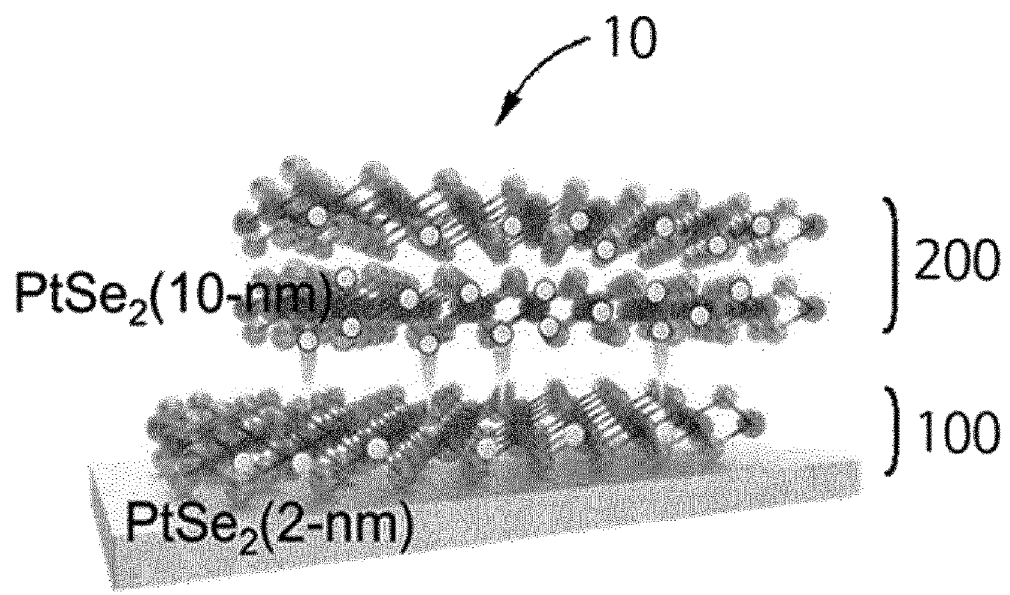
FIG. 1 is a perspective view illustrating a configuration of a transition metal dichalcogenide homojunction structure.

Specific structural or functional descriptions of exemplary embodiments in accordance with a concept of the present disclosure which are disclosed in this specification are illustrated only to describe the exemplary embodiments in accordance with the concept of the present disclosure and the exemplary embodiments in accordance with the concept of the present disclosure may be carried out by various forms but are not limited to the exemplary embodiments described in this specification.

Various modifications and changes may be applied to the exemplary embodiments in accordance with the concept of the present disclosure so that the exemplary embodiments will be illustrated in the drawings and described in detail in the specification. However, it does not limit the specific embodiments according to the concept of the present disclosure, but includes changes, equivalents, or alternatives which are included in the spirit and technical scope of the present disclosure.

Terms such as first or second may be used to describe various components, but the components are not limited by the above terms. The above terminologies are used to distinguish one component from the other component, for example, a first component may be referred to as a second component without departing from a scope in accordance with the concept of the present disclosure and similarly, a second component may be referred to as a first component.

It should be understood that, when it is described that an element is "coupled" or "connected" to another element, the element may be directly coupled or directly connected to the other element or coupled or connected to the other element through a third element. In contrast, when it is described that an element is "directly coupled" or "directly connected" to another element, it should be understood that no element is not present therebetween. Other expressions which describe the relationship between components, that is, "between" and "directly between", or "adjacent to" and "directly adjacent to" need to be interpreted by the same manner.

Terms used in the present specification are used only to describe specific exemplary embodiments, and are not intended to limit the present disclosure. A singular form may include a plural form if there is no clearly opposite meaning in the context. In the present specification, it should be understood that terms "include" or "have" indicates that a feature, a number, a step, an operation, a component, a part or the combination thereof described in the specification is present, but do not exclude a possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if it is not clearly defined in this specification.

Hereinafter, exemplary embodiments will be described in detail with reference to the accompanying drawings. However, the scope of the patent application will be not limited or restricted to exemplary embodiments below. In each of the drawings, like reference numerals denote like elements.

Figure 2:
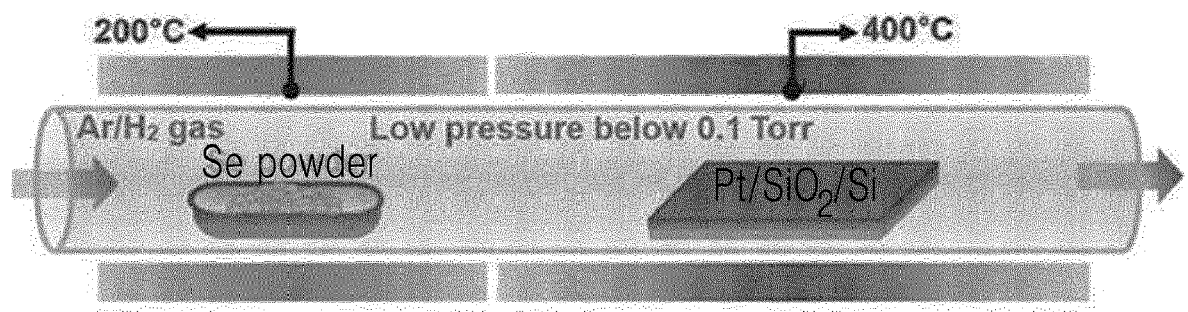
FIG. 2 is a view illustrating a forming process of a transition metal dichalcogenide homojunction structure.

FIG. 1 is a perspective view illustrating a configuration of a transition metal dichalcogenide homojunction structure 10 and FIG. 2 is a view illustrating a forming process of a transition metal dichalcogenide homojunction structure 10.

Referring to FIG. 1, a transition metal dichalcogenide homojunction structure 10 of the present disclosure may include a lower high resistance layer 100 including a plurality of $PtX_2$ layers and an upper low resistance layer 200 including a plurality of $PtX_2$ layers.

The lower high resistance layer 100 and the upper low resistance layer 200 may have different thicknesses and different numbers of growth layers.

For example, the transition metal dichalcogenide homojunction structure may vary the thickness and the number of growth layers while progressing the growth of the $PtX_2$ layer.

The lower high resistance layer 100 and the upper low resistance layer 200 may form a homojunction.

When the lower high resistance layer 100 and the upper low resistance layer 200 form a homojunction, as compared with the TMDC of the related art, the homojunction has a high thermoelectric characteristic with the same thickness to have a relatively high power factor.

A heat transfer characteristic of the lower high resistance layer 100 may be increased by the interface induced Seebeck effect with the upper low resistance layer 200.

In one exemplary embodiment, the lower high resistance layer 100 and the upper low resistance layer 200 may form a homojunction of multilayered $PtSe_2$ thin films.

That is, the transition metal dichalcogenide homojunction structure may include the lower high resistance layer 100 including a plurality of $PtSe_2$ layers and the upper low resistance layer 200 including a plurality of $PtSe_2$ layers.

Referring to FIG. 2, the lower high resistance layer 100 and the upper low resistance layer 200 may be formed by a first step of depositing a Pt thin film on an $SiO_2$/Si substrate using an RF sputter in the Ar atmosphere, and a second step of performing the selenization on the Pt thin film by a CVD method in the Ar/$H_2$ atmosphere and at a temperature of 400° C. to 500° C.

In the first step of depositing a Pt thin film on an $SiO_2$/Si substrate, prior to the Pt-deposition, the $SiO_2$/Si substrate may be continuously ultrasonic-cleaned with acetone and isopropyl alcohol for 10 minutes.

In the first step of depositing a Pt thin film on an $SiO_2$/Si substrate, the Pt deposition may be performed at a pressure adjusted with Ar of 2.0×10-3 Torr at a room temperature after maintaining a pressure of 8.0×10-5 Torr.

In the second step of performing the selenization on the Pt thin film using the CVD method, the selenization of the Pt thin film may be performed for 30 minutes at a 5% $H_2$ flow of the Ar.

For example, the lower high resistance layer 100 and the upper low resistance layer 200 may form the homojunction through the first step and the second step.

Figure 3A:
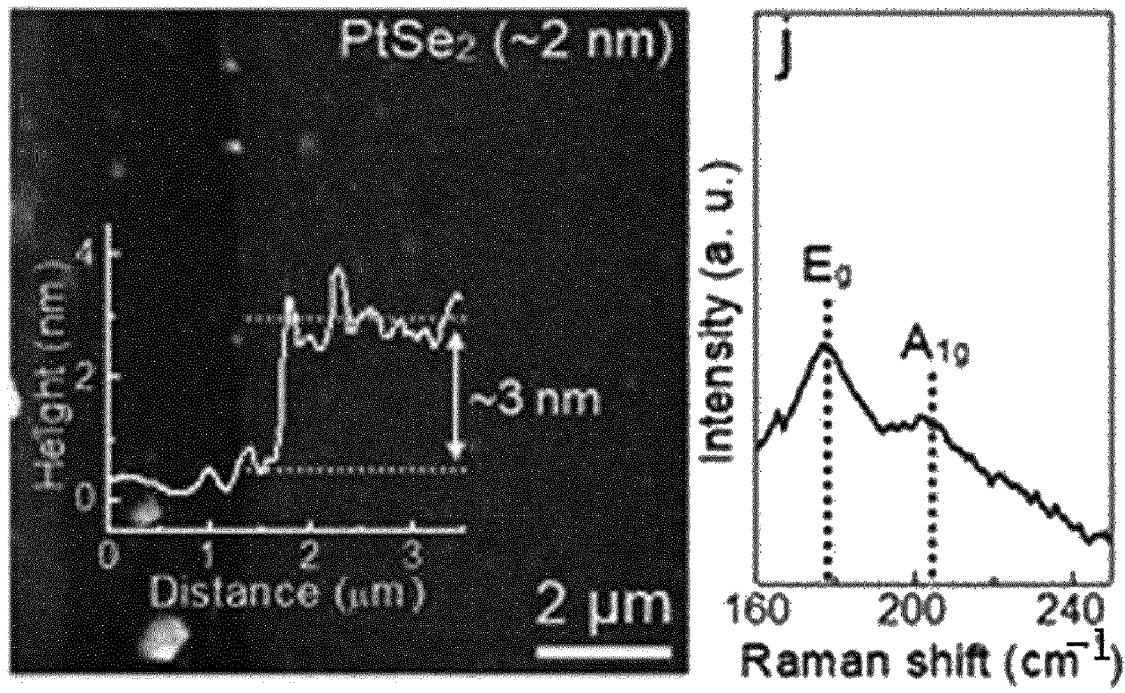
FIGS. 3A-3B are views illustrating results of forming a lower high resistance layer and an upper low resistance layer according to the forming process of FIG. 2.
Figure 3B:
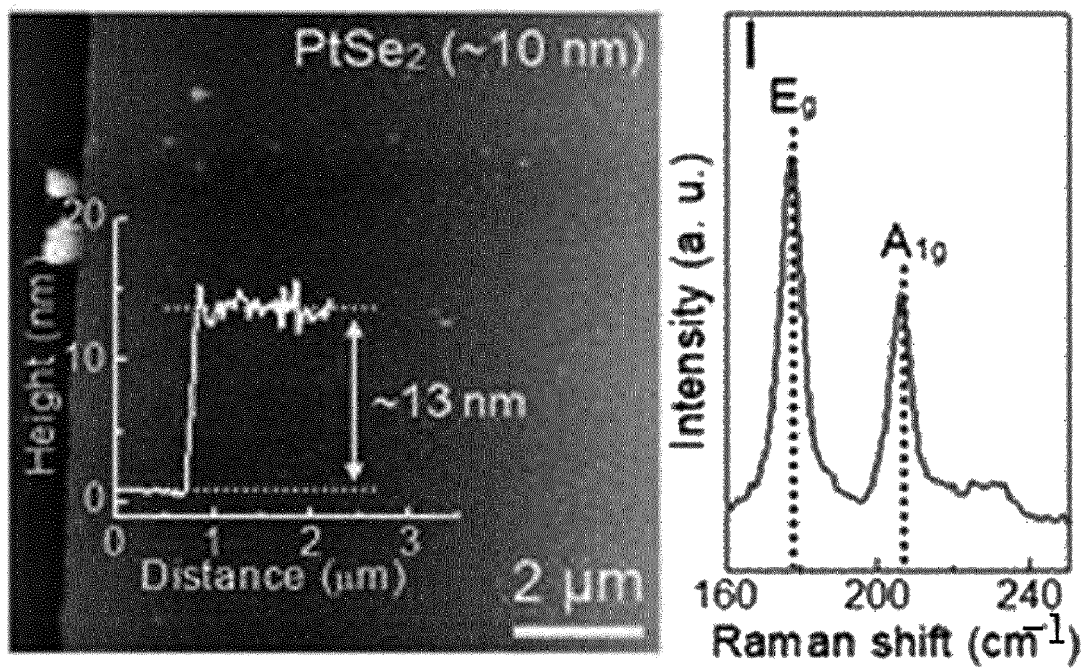

FIGS. 3A-3B are views illustrating results of forming a lower high resistance layer 100 and an upper low resistance layer 200 according to the forming process of FIG. 2.

Referring to FIGS. 3A-3B, it may be understood that in the lower high resistance layer 100 and the upper low resistance layer 200, multilayered $PtSe_2$ thin films having different thicknesses and different numbers of growth layers are formed.

FIG. 3A shows a Raman analysis result for the lower high resistance layer 100.

The lower high resistance layer 100 may include a plurality of $PtX_2$ layers.

For example, as seen from FIG. 3A, the lower high resistance layer 100 may include multilayered $PtSe_2$ thin films formed with a thickness of 2 nm or lower.

FIG. 3B shows a Raman analysis result for the upper low resistance layer 200.

The upper low resistance layer 200 may include a plurality of $PtX_2$ layers.

For example, as seen from FIG. 3B, the upper low resistance layer 200 may include multilayered $PtSe_2$ thin films formed with a thickness of 10 nm or lower.

For example, the lower high resistance layer 100 including the multilayered $PtSe_2$ thin films and the upper low resistance layer 200 including the multilayered $PtSe_2$ thin films may form the homojunction.

Figure 4:
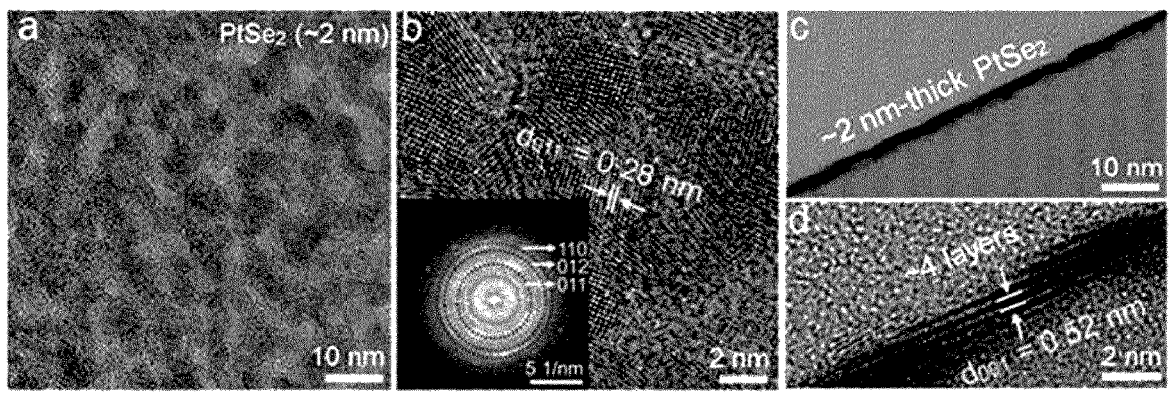
FIG. 4 is a view illustrating an optical image enlarging a lower high resistance layer.

FIG. 4 is a view illustrating an optical image enlarging a lower high resistance layer 100.

Referring to FIG. 4, the lower high resistance layer 100 may include a plurality of $PtX_2$ layers. For example, the lower high resistance layer 100 may include multilayered $PtSe_2$ thin films.

As an EDS analysis result for the lower high resistance layer 100, it was confirmed that the ratio of Pt:Se was 1:2, which meant that the $PtX_2$ layer of the lower high resistance layer 100 was formed from Pt.

As seen from FIG. 4, it may be understood from the AFM analysis that the multilayered $PtSe_2$ thin films grown on the lower high resistance layer 100 were formed with a homogeneous state without having discontinuity.

Further, a composition of the $PtX_2$ layer of the lower high resistance layer 100 may be confirmed from the spectrum of the Raman analysis and the Raman strength.

For example, the lower high resistance layer 100 may be formed with a thickness of 1 nm to 3 nm.

Each of the multilayered $PtSe_2$ thin films included in the lower high resistance layer 100 may be formed with a thickness of 0.52 nm.

For example, the lower high resistance layer 100 may include the $PtSe_2$ thin films configured by four growth layers.

Figure 5:
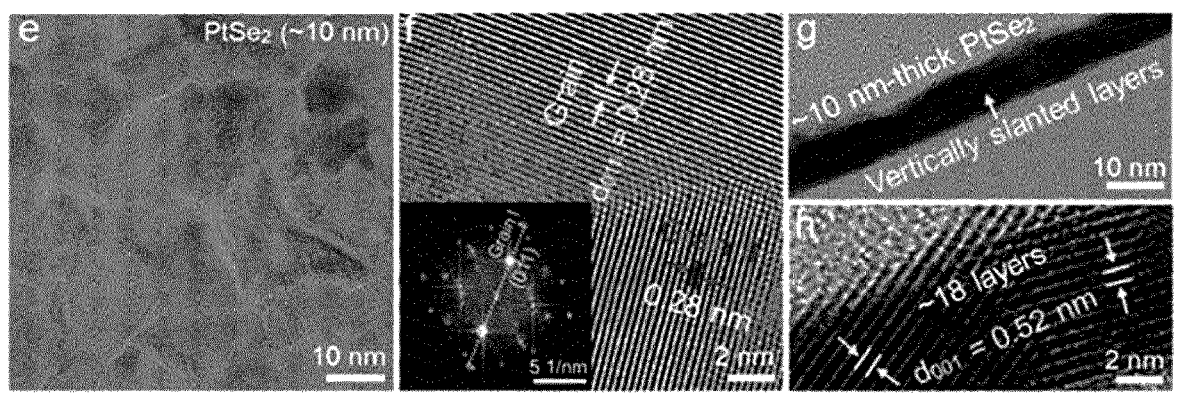
FIG. 5 is a view illustrating an optical image enlarging an upper low resistance layer.

FIG. 5 is a view illustrating an optical image enlarging an upper low resistance layer 200.

Referring to FIG. 5, the upper low resistance layer 200 may include a plurality of $PtX_2$ layers. For example, the upper low resistance layer 200 may include multilayered $PtSe_2$ thin films.

As an EDS analysis result for the upper low resistance layer 200, it was confirmed that the ratio of Pt:Se was 1:2, which meant that the $PtX_2$ layer of the upper low resistance layer 200 was formed from Pt.

As seen from FIG. 5, it may be understood from the AFM analysis that the multilayered $PtSe_2$ thin films grown on the upper low resistance layer 200 were formed with a homogeneous state without having discontinuity.

Further, a composition of the $PtX_2$ layer of the upper low resistance layer 200 may be confirmed from the spectrum of the Raman analysis and the Raman strength.

For example, the upper low resistance layer 200 may be formed with a thickness of 8 nm to 12 nm.

Each of the multilayered $PtSe_2$ thin films included in the upper low resistance layer 200 may be formed with a thickness of 0.52 nm.

For example, the upper low resistance layer 200 may include the $PtSe_2$ thin films configured by 18 growth layers.

Figure 6:
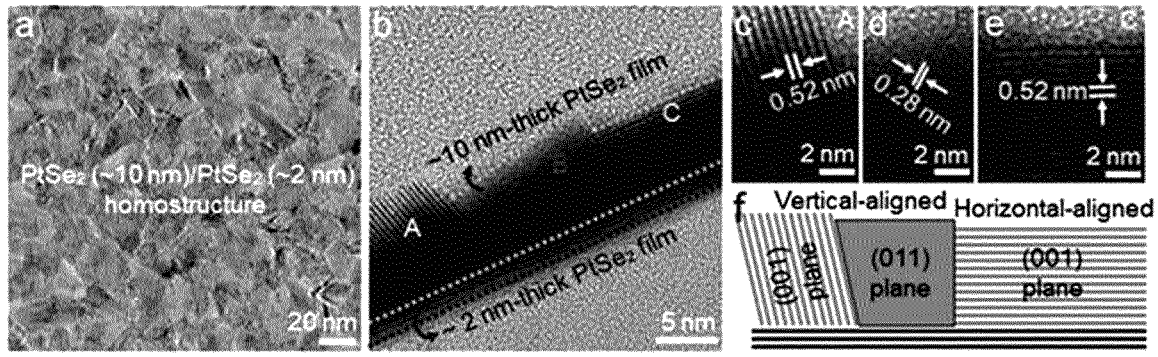
FIG. 6 is a view illustrating an optical image enlarging a homojunction structure of a lower high resistance layer and an upper low resistance layer.

FIG. 6 is a view illustrating an optical image enlarging a homojunction structure of a lower high resistance layer 100 and an upper low resistance layer 200.

Referring to FIG. 6, a transition metal dichalcogenide homojunction structure 10 may form a homojunction of a lower high resistance layer 100 including a plurality of $PtX_2$ layers and an upper low resistance layer 200 including a plurality of $PtX_2$ layers.

For example, the lower high resistance layer 100 including a plurality of $PtSe_2$ layers and the upper low resistance layer 200 including a plurality of $PtSe_2$ layers may form a homojunction.

As seen from FIG. 6, a 10 nm-thick upper low resistance layer 200 may be formed on a 2 nm-thick lower high resistance layer 100.

The lower high resistance layer 100 may include a horizontal alignment. The upper low resistance layer 200 may include a vertical alignment and a horizontal alignment.

For example, the upper low resistance layer 200 may include a laminated area (for example, a horizontal-vertical 001 plane) including a vertical alignment having a different direction from the horizontal alignment of the lower high resistance layer 100.

As another example, the upper low resistance layer 200 may include a laminated area (for example, a horizontal-horizontal 001 plane) including a horizontal alignment having the same direction and a physical distance from the horizontal alignment of the lower high resistance layer 100.

In one exemplary embodiment, the upper low resistance layer 200 activates the lower high resistance layer 100 to induce hot carrier injection from the lower high resistance layer 100 into the upper low resistance layer 200.

The lower high resistance layer 100 and the upper low resistance layer 200 form the homojunction structure to generate an interface induced Seebeck effect at the interface of the homojunction, thereby generating a thermal voltage.

For example, the lower high resistance layer 100 may have a resistance of 10 MΩ to 11 MΩ.

For example, the upper low resistance layer 200 may have a resistance of 300Ω to 20 KΩ.

The hot carriers which are injected into the upper low resistance layer 200 from the lower high resistance layer 100 move from the lower high resistance layer 100 to the upper low resistance layer 200 together with a thermally induced thermocurrent to increase the Seebeck coefficient.

Depending on the homojunction structure of the lower high resistance layer 100 and the upper low resistance layer 200, the Seebeck effect of the lower high resistance layer 100 may be measured using the upper low resistance layer 200 without separate measurement equipment.

Figure 7:
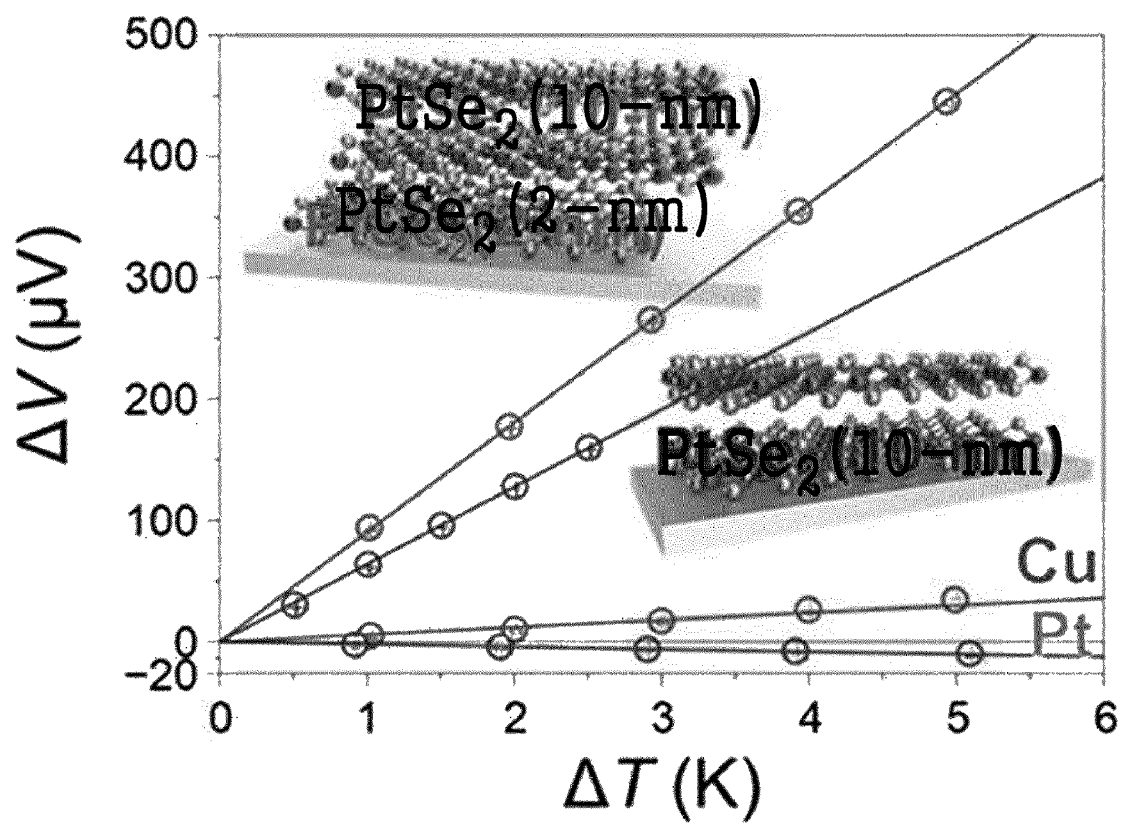
FIG. 7 is a graph illustrating a thermoelectric voltage difference according to a temperature change of a transition metal dichalcogenide homojunction structure.
Figure 8A:
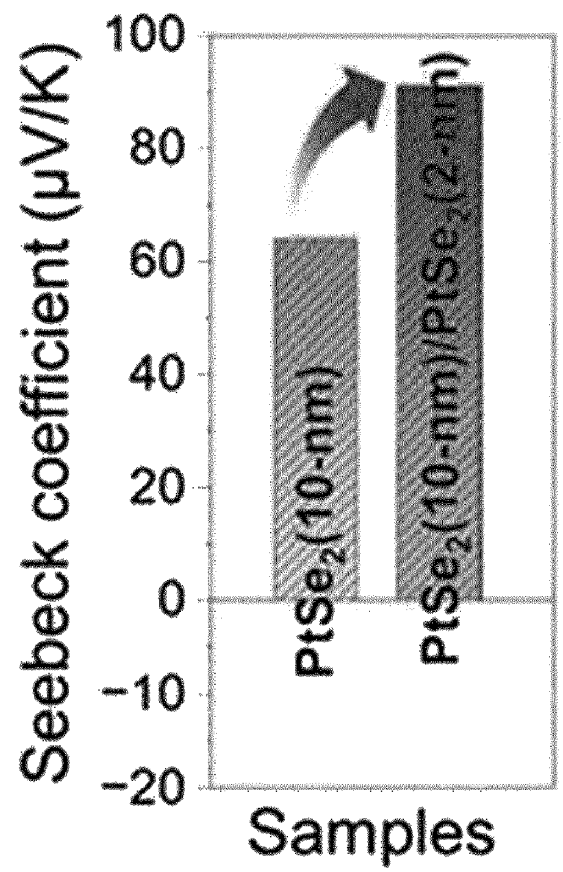
FIGS. 8A-8C are graphs comparing thin film characteristics of a transition metal dichalcogenide homojunction structure and a $PtSe_2$ thin film of the related art.
Figure 8B:
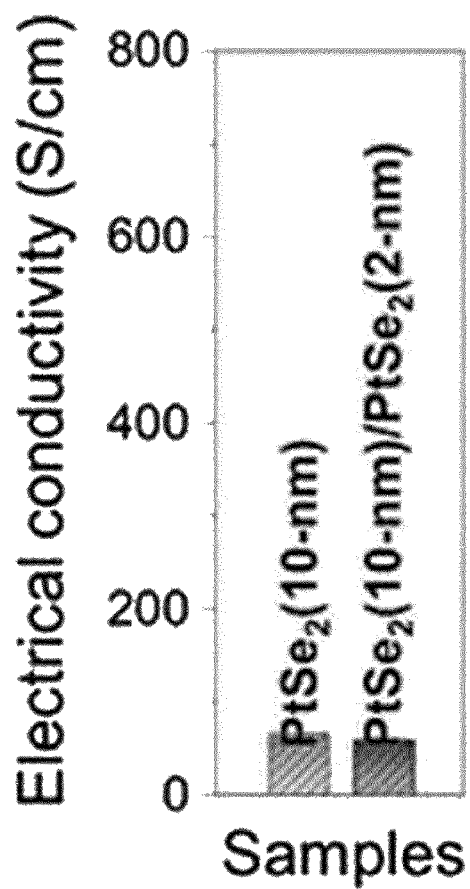
Figure 8C:
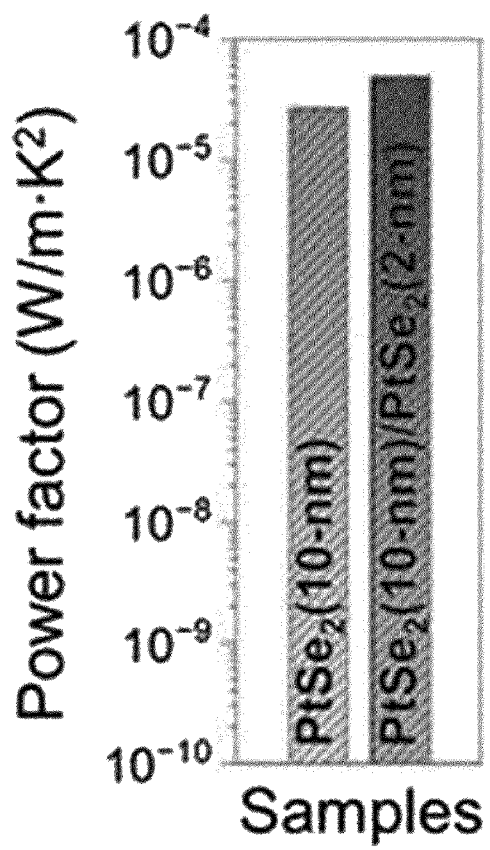

FIG. 7 is a graph illustrating a thermoelectric voltage difference according to a temperature change of a transition metal dichalcogenide homojunction structure 10, and FIGS. 8A-8C are graphs comparing thin film characteristics of a transition metal dichalcogenide homojunction structure 10 and a PtSe$_2$ thin film of the related art.

Referring to FIG. 7, when the temperature change ΔT was applied to the transition metal dichalcogenide homojunction structure 10, a thermoelectric voltage difference ΔV of the transition metal dichalcogenide homojunction structure 10 was measured.

The measurement environment was measured on a sapphire (Al$_2$O$_3$) base material to avoid the base material influence during the measurement of the Seebeck coefficient, and a measurement error was estimated to be 2% or lower.

As seen from FIG. 7, the thermoelectric voltage difference ΔV of the transition metal dichalcogenide homojunction structure 10 was measured to be higher than the PtSe$_2$ single thin film of the related art with respect to the same temperature change ΔT.

Specifically, referring to FIGS. 8A-8C, in the transition metal dichalcogenide homojunction structure 10, a Seebeck coefficient was +90.3 μV/K at the temperature of 300 K.

That is, it was confirmed that the Seebeck coefficient of the transition metal dichalcogenide homojunction structure 10 was increased by 42% as compared with the PtSe$_2$ single thin film of the related art.

Further, it may be understood that the electrical conductivity of the transition metal dichalcogenide homojunction structure 10 is a similar level to the PtSe$_2$ single thin film of the related art.

Furthermore, the power factor of the transition metal dichalcogenide homojunction structure 10 is 50 μW/mK$^2$, which is twice as high as the power factor (27 μW/mK$^2$) of the PtSe$_2$ single thin film of the related art.

Figure 9:
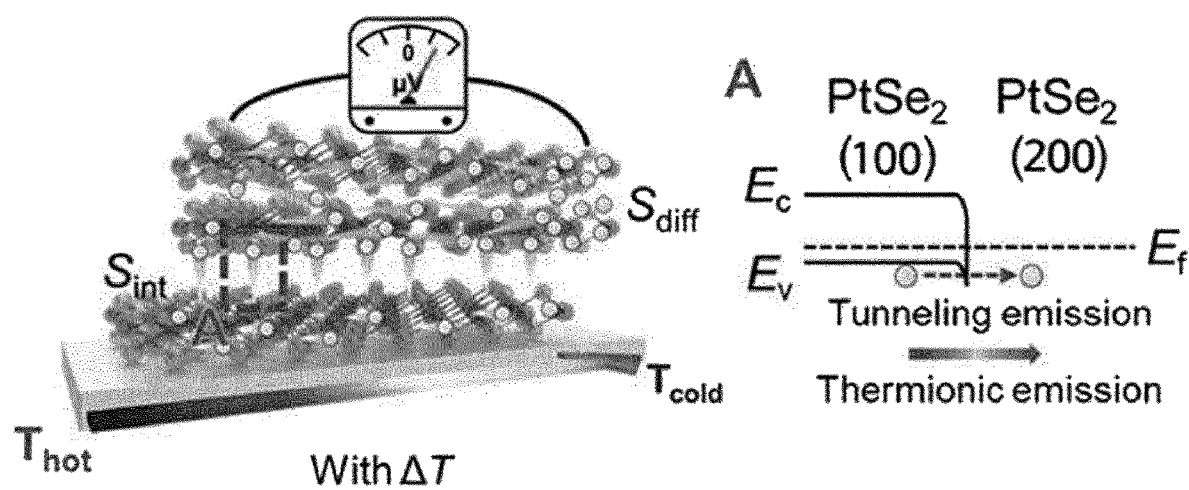
FIG. 9 is a view illustrating that a heat transfer characteristic of a lower high resistance layer is increased by an interface induced Seebeck effect.

FIG. 9 is a view illustrating that a heat transfer characteristic of a lower high resistance layer 100 is increased by an interface induced Seebeck effect.

Referring to FIG. 9, the upper low resistance layer 200 activates the lower high resistance layer 100 to induce hot carrier injection from the lower high resistance layer 100 to the upper low resistance layer 200.

A height of the Schottky barrier was very low (35 meV) to be close to the interface of the lower high resistance layer 100 and the upper low resistance layer 200 so that carriers in a high energy tail of the Fermi-Dirac distribution may be injected over the energy barrier via thermally assisted tunneling or thermionic devices.

That is, since the magnitude of the thermal energy of the ambient temperature 300K is similar to the height of the Schottky barrier between the lower high resistance layer 100 and the upper low resistance layer 200, a carrier concentration of the transition metal dichalcogenide homojunction structure 10 may increase without causing the temperature change ΔT by the thermocurrent transfer in the upper low resistance layer 200 PtSe$_2$ thin film.

The hot carrier which is injected into the upper low resistance layer 200 from the lower high resistance layer 100 moves from the lower high resistance layer 100 to the upper low resistance layer 200 together with a thermally induced thermocurrent to increase the Seebeck coefficient.

As described above, in the transition metal dichalcogenide homojunction structure 10, the lower high resistance layer 100 and the upper low resistance layer 200 form the homojunction structure to generate an interface induced Seebeck effect at the interface of the homojunction, thereby generating a thermal voltage.

Figure 10:
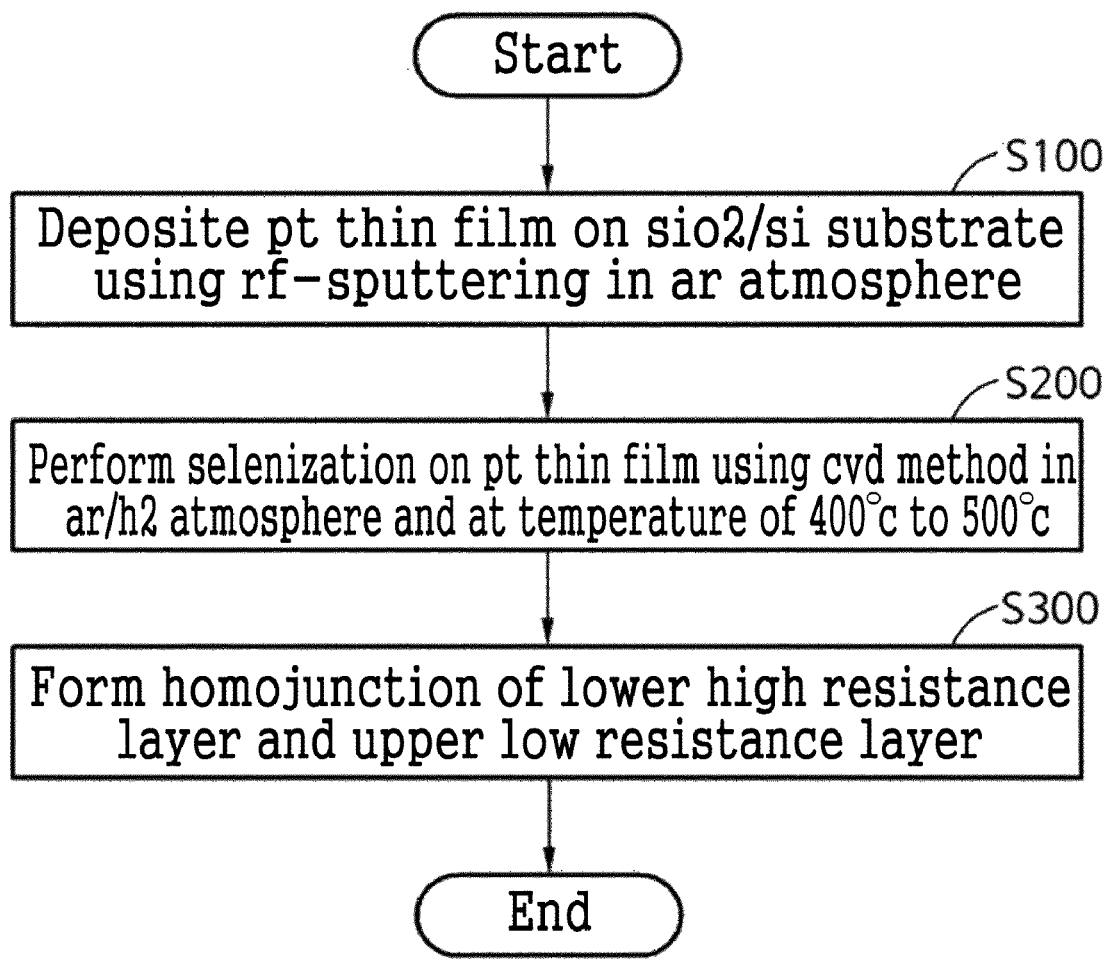
FIG. 10 is a flowchart illustrating a method for forming a transition metal dichalcogenide homojunction structure.

FIG. 10 is a flowchart illustrating a method for forming a transition metal dichalcogenide homojunction structure 10.

Referring to FIG. 10, a method for forming a transition metal dichalcogenide homojunction structure 10 may include a step S100 of depositing a Pt thin film on an SiO$_2$/Si substrate using the RF sputter at the Ar atmosphere, a step S200 of performing selenization on the Pt thin film by the CVD method in the Ar/H$_2$ atmosphere and at the temperature of 400° C. to 500° C., and a step S300 of forming a homojunction of the lower high resistance layer 100 and the upper low resistance layer 200.

For example, the lower high resistance layer 100 and the upper low resistance layer 200 may have different thicknesses and different numbers of growth layers.

For example, the heat transfer characteristic of the lower high resistance layer 100 may increase by the interface induced Seebeck effect with the upper low resistance layer 200.

In one exemplary embodiment, the lower high resistance layer 100 and the upper low resistance layer 200 may form a homojunction of multilayered PtSe$_2$ thin films.

In the transition metal dichalcogenide homojunction structure 10 according to the present disclosure, the lower high resistance layer 100 and the upper low resistance layer 200 form the homojunction to generate an interface induced Seebeck effect at the interface of the homojunction, thereby generating a thermal voltage.

Further, the transition metal dichalcogenide homojunction structure 10 according to the present disclosure may measure the Seebeck effect of the lower high resistance 100 using the upper low resistance layer 200 without separate measurement equipment.

Further, the transition metal dichalcogenide homojunction structure 10 according to the present disclosure may have a high thermoelectric characteristic with respect to the same thickness to have a high power factor.

However, this has been described above so that a redundant description thereof will be omitted.

The device described above may be implemented by a hardware component, a software component, and/or a combination of the hardware component and the software component. For example, the device and the components described in the exemplary embodiments may be implemented, for example, using one or more general purpose computers or special purpose computers such as a processor, a controller, an arithmetic logic unit (ALU), a digital signal processor, a microcomputer, a field programmable array (FPA), a programmable logic unit (PLU), a microprocessor, or any other device which executes or responds instructions. The processing device may perform an operating system (OS) and one or more software applications which are performed on the operating system. Further, the processing device may access, store, manipulate, process, and generate data in response to the execution of the software. For ease of understanding, it may be described that a single processing device is used, but those skilled in the art may understand that the processing device includes a plurality of processing elements and/or a plurality of types of processing element. For example, the processing device may include a plurality of processors or include one processor and one controller. Further, another processing configuration such as a parallel processor may be allowed.

The method according to the exemplary embodiment may be implemented as a program command which may be executed by various computers to be recorded in a computer readable medium. The computer readable medium may include solely a program command, a data file, and a data structure or a combination thereof. The program instruction recorded in the medium may be specifically designed or constructed for the exemplary embodiment or known to those skilled in the art of a computer software to be used. Examples of the computer readable recording medium include magnetic media such as a hard disk, a floppy disk, or a magnetic tape, optical media such as a CD-ROM or a DVD, magneto-optical media such as a floptical disk, and a hardware device which is specifically configured to store and execute the program command such as a ROM, a RAM, and a flash memory. Examples of the program command include not only a machine language code which is created by a compiler but also a high level language code which may be executed by a computer using an interpreter. The hardware device may operate as one or more software modules in order to perform the operation of the exemplary embodiment and vice versa.

Although the exemplary embodiments have been described above by the drawings, various modifications and changes can be made from the above description by those skilled in the art. For example, even when the above-described techniques are performed by different order from the described method and/or components such as systems, structures, devices, or circuits described above are coupled or combined in a different manner from the described method or replaced or substituted with other components or equivalents, the appropriate results can be achieved. Therefore, other implements, other embodiments, and equivalents to the claims are within the scope of the following claims.

What is claimed is:

1. A transition metal dichalcogenide homojunction structure, comprising:
    a first layer with a predetermined high resistance including a first plurality of $PtX_2$ layers; and
    a second layer with a predetermined low resistance, formed on the first layer, which includes a second plurality of the $PtX_2$ layers and has different thickness and number of growth layers from the first layer,
        wherein the first layer and the second layer form a homojunction, and in the first layer, a heat transfer characteristic is increased by an interface induced Seebeck effect with the second layer.

2. The transition metal dichalcogenide homojunction structure according to claim 1,
    wherein the first layer and the second layer form a homojunction of multilayered $PtSe_2$ thin films.

3. The transition metal dichalcogenide homojunction structure according to claim 2,
    wherein the second layer activates the first layer to induce an injection of hot carriers from the first layer into the second layer.

4. The transition metal dichalcogenide homojunction structure according to claim 3,
    wherein the hot carriers which are injected from the first layer to the second layer move from the first layer to the second layer together with thermally induced thermocurrent to increase a Seebeck coefficient.

5. The transition metal dichalcogenide homojunction structure according to claim 2,
    wherein the first layer and the second layer are formed by first depositing a Pt thin film on an $SiO_2/Si$ substrate using an RF sputter in an Ar atmosphere and secondly performing selenization on the Pt thin film by a CVD method in an $Ar/H_2$ atmosphere and at a temperature of 400° C. to 500° C.

6. The transition metal dichalcogenide homojunction structure according to claim 2,
    wherein the first layer is formed with a first thickness of 1 nm to 3 nm, and the second layer is formed with a second thickness of 8 nm to 12 nm.

7. The transition metal dichalcogenide homojunction structure according to claim 2,
    wherein the first layer includes a first $PtSe_2$ thin film having four growth layers, and the second layer includes a second $PtSe_2$ thin film having 18 growth layers.

8. The transition metal dichalcogenide homojunction structure according to claim 2,
    wherein the first layer has a resistance of 10 MΩ to 11 MΩ, and the second layer has a resistance of 300Ω to 20 KΩ.

* * * * *